JOGGING DEVICE IN APPARATUS FOR TREATING SEMICONDUCTOR WAFERS IN GAS

Filed May 25, 1964

United States Patent Office 3,295,492

Patented Jan. 3, 1967

3,295,492

JOGGING DEVICE IN APPARATUS FOR TREATING SEMICONDUCTOR WAFERS IN GAS

Norbert Schink, Erlangen, Germany, assignor to Siemens-Schuckertwerke Aktiengesellschaft, Berlin-Siemensstadt and Erlangen, Germany, a corporation of Germany Filed May 25, 1964, Ser. No. 369,857
Claims priority, application Germany, June 1, 1963, S 85,490
6 Claims. (Cl. 118—48)

My invention relates to an apparatus for treating semiconductor wafers in gas.

Various methods are known in semiconductor technology in which semiconductor wafers are treated in a gaseous atmosphere. An example thereof is a so-called diffusion process of semiconductor manufacture in which semiconductor discs or wafers of one conductance type are heated in a gas containing dopant substances which diffuse into the semiconductor wafers so as to produce zones of opposite conductance type. The dopant passes from the gaseous phase into the semiconductor material and dopes a surface region or layer of the semiconductor wafer so that its conductance type is changed.

Methods of producing components of semiconductor devices are furthermore known whereby semiconductor material from a gaseous phase is precipitated on a heated semiconductor element. The precipitated layer usually has a dopant concentration or a conductance type differing from that of the semiconductor element on which the layer is deposited.

In all of the aforementioned known processes, it is essential that the semiconductor wafers be suitably arranged so that the dopant or semiconductor substances, as the case may be, has access to all of the surfaces of the disc-shaped semiconductor wafer and particularly to the two flat surfaces of the wafer. For this purpose, when carrying out the known processes, the semiconductor wafers have usually been supported in holders and arranged in a manner similar to the arrangement of phonograph records in conventional racks therefor. Another well known practice, particularly when the semiconductor wafers are being subjected to a diffusion process, is to stack the semiconductor wafers loosely one upon the other and to subject them then to the appropriate treatment.

In carrying out certain processes, however, it is not possible to stack the semiconductor wafers so that their flat surfaces lie one on top of the other because the semiconductor wafers would consequently stick to one another while they were being treated. This is especially true when semiconductor material is being precipitated thereon from the initially gaseous phase. It is furthermore also undesirable during certain diffusion processes for the semiconductor wafers to touch one another because the oxide layers formed thereon would consequently coalesce. Such is the case for those diffusion processes in which the material that is to be added i.e. a dopant, is deposited on the surface of the semiconductor disc and an oxide layer of semiconductor material is then coated thereon, and the diffusion of the deposited dopant into the semiconductor disc is effected by applying heat thereto.

It is furthermore desirable to avoid using vertically disposed spaced supports such as are found in phonograph record racks, wherein the semiconductor wafers are arranged vertically on end next to one another, because considerable added space is necessary for such supports. Supports of this type are comprised, for example, of a member that is itself formed of semiconductor material in which transverse slots have been provided to receive the semiconductor wafers individually. The width of the slots as well as the width of the semiconductor material between the slots require more space than would be necessary if the semiconductor wafers were stacked one upon another. When exact temperatures must be maintained, it is desirable to keep the required space to an absolute minimum, as is the case for the very limited usable space in a tubular furnace, for example, of the type shown in application Serial No. 205,740, filed June 27, 1962, and application Serial No. 209,489, filed July 11, 1962, now Patent Nos. 3,140,965 and 3,140,966, respectively, both of which are assigned to the same assignee as the assignee of this application. Furthermore, a coalescence or reaction can take place between the semiconductor wafers and the supports, which can consist of quartz for example.

It is therefore an object of my invention to provide an apparatus for the treatment of semiconductor wafers in a gaseous atmosphere which will avoid the disadvantages of the known apparatuses mentioned hereinabove.

To this end and in accordance with my invention, I provide an apparatus for treating semiconductor wafers in gas that has a holder capable of maintaining a stack of semiconductor wafers lying with their flat surfaces against one another in a vertical position. The holder is also provided with a tappet or plunger vertically displaceable by a drive mechanism for at least indirectly engaging the stack of semiconductor wafers.

Other features which are considered as characteristic for the invention are set forth in the appended claims.

Although the invention has been illustrated and described as embodied in an apparatus for treating semiconductor wafers in gas, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings, in which.

Figures 1, 2, 3, 4:
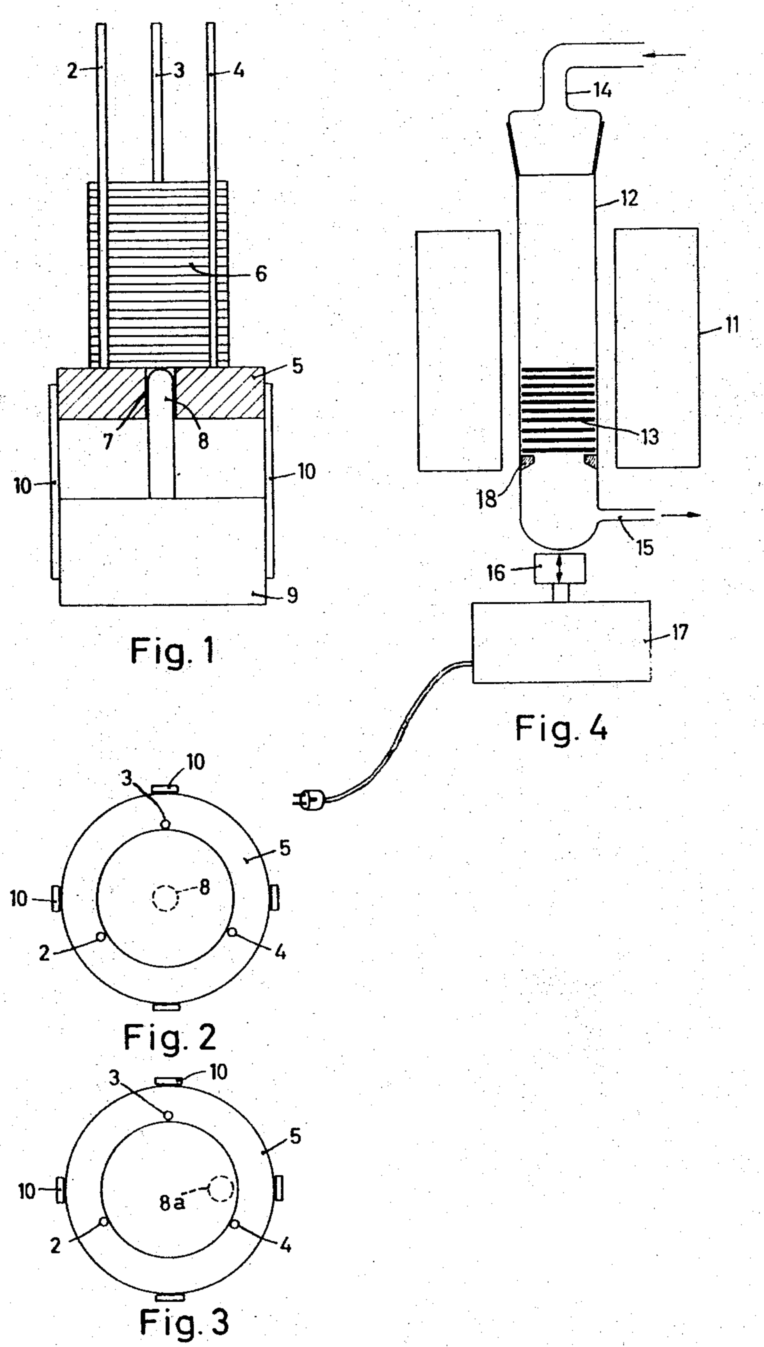
FIG. 1 is an elevational view, partly in section, of the apparatus for treating semiconductor wafers in accordance with my invention.
FIG. 2 is a top plan view of FIG. 1.
FIG. 3 is a slightly modified top plan view of the device shown in FIGS. 1 and 2.
FIG. 4 is a diagrammatic elevational view of another embodiment of the device constructed in accordance with my invention.

Referring now to the drawings and first particularly to FIGS. 1 and 2, there are shown three rods 2, 3, 4, consisting for example of quartz material, that are suitably held in a holder 5, which can also for example consist of quartz or silicon. Semiconductor discs or wafers 6 are stacked one on top of each other between the rods 2, 3, 4, as shown more clearly in FIG. 2, supported on the holder 5. The holder 5 is provided with an opening 7 through which a tappet or plunger 8 extends from below as shown in FIG. 1 so as to engage the lowermost wafer 6 of the stack. The plunger 8 is connected to a drive mechanism 9 for displacing the plunger in a vertical direction. The holder 5 is spaced from and secured to the drive mechanism casing by the strut members 10 and suitable fastening means (not shown).

When carrying out the treatment of the semiconductor wafers, the entire device shown in FIG. 1 can be placed in a furnace filled or traversed by a suitable treatment gas. Only the lower part of the drive mechanism 9 need extend from the bottom of the furnace or heater. The drive mechanism 9 may be electrically driven, and provides a reciprocating motion in a vertical direction to the plunger 8. The semiconductor wafers 6 are consequently set into a shaking or vibratory motion which increases the spacing between the individual semiconductor wafers. By selecting the correct stroke and frequency of vibration of the plunger 8, it is possible to keep the semiconductor wafers apart from one another and in doing so the height of the stack becomes considerably increased due to the increased spacing between the individual semiconductor wafers. Thus, if each of the semiconductor wafers is approximately 300 microns thick and the average distance between the semiconductor wafers caused by the vibration of the plunger is also approximately 300 microns, the height of the stack of semiconductor wafers is accordingly doubled.

A modification of the apparatus as shown in FIG. 3 is the location of the plunger 8*a* in an eccentric position with respect to the apparatus and the semiconductor wafers so that the stack of wafers 6 are repeatedly engaged from below by the plunger 8*a* at one side thereof. This causes the individual wafers to disengage from each other on one side and engage each other only along the edges thereof as they roll around the edges of the next lower wafer respectively.

In the embodiment shown in FIG. 4, there is provided a quartz tube 12 which serves as a holder for a stack of semiconductor discs 13 which are mounted on an internal shoulder 18 provided in the tube 12. The tube and semiconductor wafers are surrounded by an induction or resistance furnace 11 for example. A smoothly ground opening is provided at the top of the tube 12, as shown in FIG. 4, in which a hollow stopper formed with a tube 14 is inserted. A suitable gas flow for treating the semiconductor wafers such as a gaseous compound of the semiconductor material (silicochloroform or silicon tetrachloride, for example) and a carrier gas such as hydrogen is supplied to the tube 12 through the tube 14. An outlet 15 is also provided at the lower end of the tube 12 as shown in FIG. 4 for exhausting the gas supplied through the tube 14. A plunger or tappet 16 connected to and actuated by an electrically operated drive mechanism 17 produces a vibratory displacement, in the direction of the double headed arrows, of the tube 12 supported thereon and consequently of the semiconductor wafers 13 enclosed therein, causing the wafers to become spaced from one another to permit access to the surfaces thereof of the gas stream supplied to the tube 12.

The apparatus constructed in accordance with my invention is particularly applicable for processes in which it is desirable that the semiconductor discs or wafers are spaced the smallest possible distance from one another. In such processes, a stack of semiconductor discs as shown particularly in FIG. 4 is placed within the apparatus in a suitable container such as the quartz tube 12 and a gas is supplied therein that is capable of effecting transport of semiconductor material from one disc to the next under the influence of a temperature gradient such as is described in the aforementioned application Serial Nos. 205,740 and 209,489. In the case of silicon, for example, the sealed container 12 can be filled with a mixture of silicochloroform and hydrogen and a temperature gradient can be produced along the stack of semiconductor discs of, for example 1350° C. at the top of the stack to 1300° C. at the bottom of the stack. Transport of the semiconductor material then takes place from succeeding warmer to adjacent colder semiconductor discs or in other words from the lower side of each disc to the upper side of the next adjacent disc lying thereon. By stacking semiconductor discs of different conductance type, i.e. n or p, or of different dopant concentration alternately on top of one another, such a process can be employed in producing components of semiconductor devices having p-n junctions, for example, since the dopant substances also migrate with the semiconductor material during the transport.

Rotary motors with an attached eccentric cam shaft can serve as the drive mechanism for the plunger or tappet. However, electrically operated oscillatory armature motors such as are employed in electric shavers can also be used for this purpose. In the latter type of drive mechanism oscillating motions are produced directly by electromagnetic means. A suitable vibrating frequency for the plunger is 50 to 5000 cycles per second and more particularly suitable is a vibration of approximately 100 cycles per second. The length of stroke of the plunger or tappet can be between 5 and 500 microns depending on the size of the semiconductor wafers as well as the distance of the spacing desired between the individual semiconductor wafers.

I claim:

1. In an apparatus for heat treating semiconductor wafers in gas, the combination comprising furnace means, holder means for vertically supporting a stack of semiconductor wafers superimposed on one another within said furnace means for heat treating the wafers therein, and oscillating means for imparting a series of shocks to the semiconductor wafers of said stack having at least a component in the axial direction thereof as the wafers are being heat treated whereby each of said heated semiconductor wafers is displaced and at least partly spaced temporarily from the adjacent semiconductor wafer of the stack.

2. In an apparatus for heat treating semiconductor wafers in gas, the combination comprising a furnace, holder means for vertically supporting a stack of semiconductor wafers superimposed on one another within said furnace for heat treating the wafers therein, plunger means engageable with said stack of wafers, and drive means for reciprocating said plunger means into alternating engagement with said stack of wafers and for imparting a series of shocks to the semiconductor wafers of said stack having at least a component in the axial direction thereof as the wafers are being heat treated whereby each of said heated semiconductor wafers is displaced and at least partly spaced temporarily from the adjacent semiconductor wafer of the stack.

3. In an apparatus for heat treating semiconductor wafers in gas, the combination comprising a furnace, holder means for vertically supporting a stack of semiconductor wafers coaxially superimposed on one another within said furnace for heat treating the wafers therein, plunger means coaxially aligned and engageable with said stack of wafers, and drive means for reciprocating said plunger means in the axial direction of said stack of wafers and into alternating engagement with said stack for imparting a series of shocks to the semiconductor wafers of said stack having at least a component in the axial direction thereof as the wafers are being heat treated whereby each of said heated semiconductor wafers is displaced and at least partly spaced temporarily from the adjacent semiconductor wafer of the stack.

4. In an apparatus for heat treating semiconductor wafers in gas, the combination comprising a furnace, holder means for vertically supporting a stack of semiconductor wafers coaxially superimposed on one another within said furnace for heat treating the wafers therein, plunger means located beneath said stack and engageable with the lowermost wafer of said stack, said plunger means being radially spaced from the axis of said stack, and drive means for reciprocating said plunger means in a direction parallel to the axis of said stack and into alternating engagement with the lowermost wafer of said stack for imparting a series of shocks to the semiconductor wafers of said stack having at least a component in the axial direction thereof as the wafers are being heat treated whereby each of said heated wafers is displaced and partly spaced temporarily from the adjacent wafer of the stack.

5. In an apparatus for heat treating semiconductor wafers in gas, the combination comprising a furnace, tubular holder means for receiving a supply of treatment gas and for internally supporting a vertically disposed stack of semiconductor wafers superimposed on one another within said furnace for heat treating the wafers therein, plunger means engageable with said tubular holder means, and drive means for reciprocating said plunger means into alternating engagement with said tubular holder means and for imparting through said tubular holder means a series of shocks to the semiconductor wafers of said stack having at least a component in the axial direction thereof as the wafers are being heat treated whereby each of said heated semiconductor wafers is displaced and at least partly spaced temporarily from the adjacent semiconductor wafer of the stack.

6. An apparatus for heat treating semiconductor wafers in gas comprising a tubular holder adapted to receive a supply of treatment gas, said tubular holder internally supporting a vertically disposed stack of semiconductor wafers loosely superimposed on one another, furnace means external to said tubular holder for heating the same and the wafers disposed therein, plunger means located below said tubular holder and engageable therewith, and drive means for reciprocating said plunger means into alternating engagement with said tubular holder and for imparting a series of shocks through said tubular holder to said loosely superimposed semiconductor wafers of said stack having at least a component in the axial direction thereof as the wafers are being heated whereby each of said heated semiconductor wafers is displaced and at least partly spaced temporarily from the adjacent semiconductor wafer of the stack so that substantially all of the surfaces of said semiconductor wafers are exposed to said treatment gas.

References Cited by the Examiner

UNITED STATES PATENTS 1,620,058 3/1927 Bell et al. ------------- 214—6

MORRIS KAPLAN, *Primary Examiner.*